US010861894B2

(12) United States Patent
Wu et al.

(10) Patent No.: US 10,861,894 B2
(45) Date of Patent: Dec. 8, 2020

(54) MULTIPLE DEEP TRENCH ISOLATION (MDTI) STRUCTURE FOR CMOS IMAGE SENSOR

(71) Applicant: Taiwan Semiconductor Manufacturing Co., Ltd., Hsin-Chu (TW)

(72) Inventors: Wei Chuang Wu, Tainan (TW); Ching-Chun Wang, Tainan (TW); Dun-Nian Yaung, Taipei (TW); Feng-Chi Hung, Chu-Bei (TW); Jen-Cheng Liu, Hsin-Chu (TW); Yen-Ting Chiang, Tainan (TW); Chun-Yuan Chen, Tainan (TW); Shen-Hui Hong, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/661,166

(22) Filed: Oct. 23, 2019

(65) Prior Publication Data

US 2020/0058686 A1    Feb. 20, 2020

Related U.S. Application Data

(62) Division of application No. 15/822,701, filed on Nov. 27, 2017, now Pat. No. 10,461,109.

(51) Int. Cl.
*H01L 27/146* (2006.01)
*H04N 5/369* (2011.01)
*H04N 5/374* (2011.01)

(52) U.S. Cl.
CPC ...... *H01L 27/1463* (2013.01); *H01L 27/1464* (2013.01); *H01L 27/14605* (2013.01);
(Continued)

(58) Field of Classification Search
CPC ... H01L 27/14; H01L 27/146; H01L 27/1463; H01L 27/14605; H01L 27/14607;
(Continued)

(56) References Cited

U.S. PATENT DOCUMENTS 9,431,452 B1    8/2016   Liu et al.
9,659,989 B1 *  5/2017   Ai ..................... H01L 21/76237
(Continued)

FOREIGN PATENT DOCUMENTS

TW    201403833 A    1/2014

OTHER PUBLICATIONS

Non-Final Office Action dated Feb. 19, 2019 for U.S. Appl. No. 15/822,701.
(Continued)

*Primary Examiner* — Fazli Erdem
(74) *Attorney, Agent, or Firm* — Eschweiler & Potashnik, LLC (57) ABSTRACT

The present disclosure relates to a CMOS image sensor having a multiple deep trench isolation (MDTI) structure, and an associated method of formation. In some embodiments, a plurality of photodiodes is formed from a front-side of a substrate. A plurality of boundary deep trench isolation (BDTI) trenches having a first depth and a plurality of multiple deep trench isolation (MDTI) trenches having a second depth are formed from a back-side of the substrate. A stack of dielectric layers is formed in the BDTI trenches and the MDTI trenches. A plurality of color filters is formed overlying the stack of dielectric layers corresponding to the plurality of photodiodes.

20 Claims, 8 Drawing Sheets

(52) U.S. Cl.
CPC .. *H01L 27/14607* (2013.01); *H01L 27/14612* (2013.01); *H01L 27/14621* (2013.01); *H01L 27/14645* (2013.01); *H01L 27/14685* (2013.01); *H01L 27/14689* (2013.01); *H04N 5/3696* (2013.01); *H04N 5/374* (2013.01); *H01L 27/14627* (2013.01); *H01L 27/14632* (2013.01); *H01L 27/14636* (2013.01); *H01L 27/14641* (2013.01); *H01L 27/14687* (2013.01)

(58) Field of Classification Search
CPC ......... H01L 27/14612; H01L 27/14621; H01L 27/14645; H01L 27/14685; H01L 27/14689; H01L 27/1464
USPC ....................................................... 257/228
See application file for complete search history.

(56) References Cited

U.S. PATENT DOCUMENTS

| | | |
|---|---|---|
| 10,276,618 B2 | 4/2019 | Chen et al. |
| 2015/0340391 A1 | 11/2015 | Webster |
| 2015/0372034 A1 | 12/2015 | Chen et al. |
| 2016/0056200 A1 | 2/2016 | Lee et al. |
| 2016/0276394 A1 | 9/2016 | Chou et al. |
| 2017/0062495 A1 | 3/2017 | Huang et al. |
| 2017/0062512 A1 | 3/2017 | Chou et al. |
| 2017/0104020 A1* | 4/2017 | Lee ..................... H01L 27/1463 |
| 2017/0117309 A1 | 4/2017 | Chen et al. |
| 2017/0287975 A1 | 10/2017 | Koo et al. |
| 2018/0151615 A1 | 5/2018 | Wen et al. |
| 2018/0151759 A1 | 5/2018 | Huang et al. |
| 2018/0286897 A1 | 10/2018 | Watanabe et al. |
| 2018/0301502 A1* | 10/2018 | Lee ..................... H01L 27/1463 |
| 2018/0337211 A1 | 11/2018 | Su et al. |
| 2019/0067355 A1* | 2/2019 | Li ..................... H01L 27/14607 |
| 2019/0096929 A1* | 3/2019 | Chiang ............. H01L 27/14689 |

OTHER PUBLICATIONS

Notice of Allowance dated Jun. 19, 2019 for U.S. Appl. No. 15/822,701.

\* cited by examiner

MULTIPLE DEEP TRENCH ISOLATION (MDTI) STRUCTURE FOR CMOS IMAGE SENSOR

REFERENCE TO RELATED APPLICATION

This Application is a Divisional of U.S. application Ser. No. 15/822,701, filed on Nov. 27, 2017, the contents of which are hereby incorporated by reference in their entirety.

BACKGROUND

Digital cameras and optical imaging devices employ image sensors. Image sensors convert optical images to digital data that may be represented as digital images. An image sensor includes a pixel array (or grid) for detecting light and recording intensity (brightness) of the detected light. The pixel array responds to the light by accumulating a charge. The accumulated charge is then used (for example, by other circuitry) to provide a color and brightness signal for use in a suitable application, such as a digital camera. Pixel sensors often manifest as charge-coupled devices (CCDs) or complementary metal oxide semiconductor (CMOS) devices. Relative to CCD pixel sensors, CMOS pixel sensors provide lower power consumption, smaller size, and faster data processing. Further, CMOS pixel sensors provide a direct digital output of data and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, computers, etc.) include an image sensor for capturing images. One example of such an image sensor is a CMOS image sensor (CIS) including an array of active pixel sensors corresponding to an array of color filters. Under the color filters, the CMOS image sensor has a photo absorption layer. A thickness of the photo-absorption layer may be optimized to absorb visible light with acceptable lateral crosstalk among adjacent pixels. On the other hand, the demand of non-visible, especially near-infrared (NIR) sensitive image sensors for security, personal authentication, and range finding applications has been growing. To make cutting-edge CMOS image sensor applicable for NIR use, it is important to enhance NIR sensitivity. One approach to improve NIR sensitivity is to make the photo absorption layer thicker, which unfortunately would increase lateral crosstalk and degrade the sensing quality, especially for small pixel sizes. In addition, chip cost is increased because of the fabrication of thick photo absorption layer including doping profile that may need ion implanters with higher energy.

The present disclosure relates to a CMOS image sensor comprising multiple deep trench isolation (MDTI) structure disposed within the individual pixel region to improve NIR sensitivity, and an associated method of formation. In some embodiments, the CMOS image sensor has a plurality of pixel regions disposed on the substrate and respectively comprising a photodiode configured to convert radiation that enters the substrate from the back-side into an electrical signal. A boundary deep trench isolation (BDTI) structure is disposed between adjacent pixel regions, extending from the back-side of the substrate to a first depth within the substrate, and surrounding the photodiode. A multiple deep trench isolation (MDTI) structure is disposed within the individual pixel region, extending from the back-side of the substrate to a second depth within the substrate, and overlying the photodiode. One or more dielectric layers fill in a BDTI trench of the BDTI structure and a MDTI trench of the MDTI structure. The dielectric layers have a dielectric constant smaller than that of the substrate, such that the incoming radiation is re-directed towards photodiode region when hitting sidewalls of the BDTI structure and MDTI structure. Thereby, lateral photon crosstalk is decreased and NIR quantum efficiency is improved.

Figure 1:
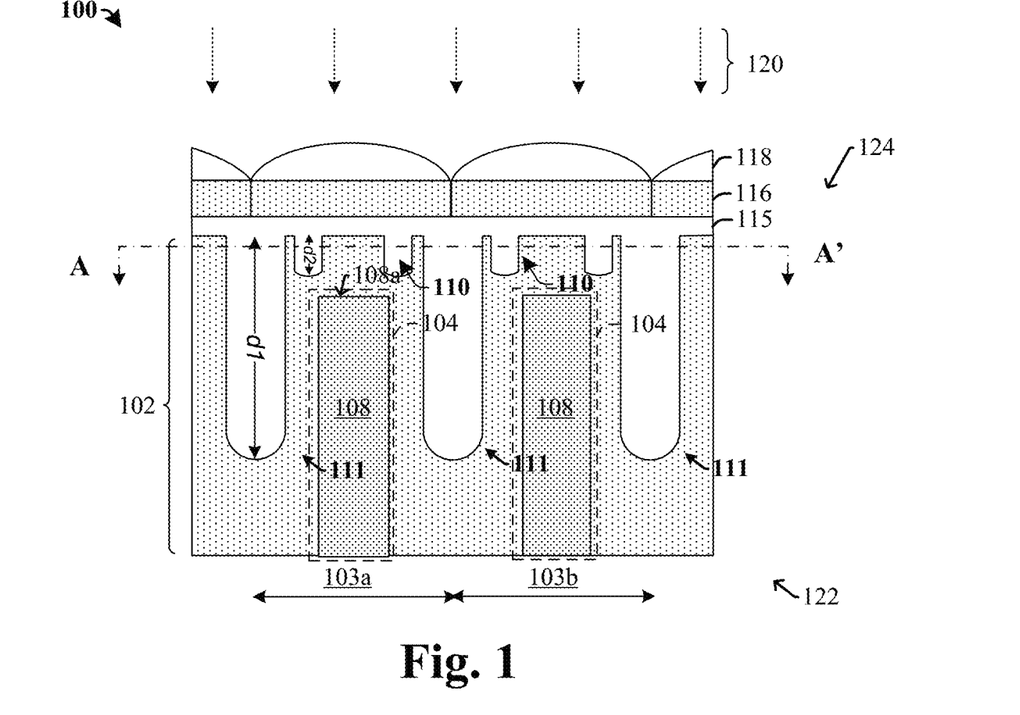
FIG. 1 illustrates a cross-sectional view of some embodiments of a CMOS (complementary metal-oxide-semiconductor) image sensor having a multiple deep trench isolation (MDTI) structure.

FIG. 1 illustrates a cross-sectional view 100 of some embodiments of a CMOS image sensor having a multiple deep trench isolation (MDTI) structure. The CMOS image sensor comprises a substrate 102 having a front-side 122 and a back-side 124. The substrate 102 functions as a photo absorption layer for the CMOS image sensor. In various embodiments, the substrate 102 may comprise any type of semiconductor body (e.g., silicon/CMOS bulk, SiGe, etc.) such as a semiconductor wafer or one or more die on a wafer, as well as any other type of semiconductor and/or epitaxial layers formed thereon and/or otherwise associated therewith. The substrate 102 comprises a plurality of pixel regions that may be arranged within the substrate 102 in an array comprising rows and/or columns, such as pixel regions 103a, 103b shown in FIG. 1. The pixel regions 103a, 103b respectively comprises a photodiode 104 configured to convert incident radiation 120 (e.g., photons) into an electric signal. In some embodiments, the photodiode 104 comprises a doped layer 108 within the substrate 102 having a first doping type (e.g., n-type doping) and an adjoining region of the substrate 102 having a second doping type (e.g., p-type doping) that is different than the first doping type. The doped layer 108 and the adjoining region of the substrate 102 form a depletion region at an interface region of a P-N junction structure. When a photon of sufficient energy strikes the photodiode 104, an electron-hole pair is generated and then swept from the P-N junction by the built-in electric field of the depletion region. Thus a photocurrent is produced.

A boundary deep trench isolation (BDTI) structure 111 is disposed in the substrate 102, extending from the back-side 124 to a first depth d1 within the substrate 102. The BDTI structure 111 is disposed between and isolates adjacent pixel regions 103a, 103b and surrounding the photodiode 104. A multiple deep trench isolation (MDTI) structure 110 is disposed within the individual pixel region 103a or 103b, extending from the back-side 124 of the substrate 102 to a second depth d2 within the substrate 102, and overlying the photodiode 104. In some embodiments, the first depth d1 is greater than the second depth d2. A ratio of the first depth d1 to the second depth d2 may be in a range of from about 1:2 to about 1:6. The BDTI structure 111 extends from a planar top surface of the substrate 102 to a position lower than a top surface 108a of the doped layer 108, while the MDTI structure 110 extends from the planar top surface of the substrate 102 to a position above the top surface 108a of the doped layer 108. The doped layer 108 and the MDTI structure 110 may be separated by the substrate 102. A dielectric layer 115 fills in a BDTI trench of the BDTI structure 111 and a MDTI trench of the MDTI structure 110. In some embodiments, the dielectric layer 115 may be disposed on the planar top surface of the substrate 102 and continuously extends in lateral between the BDTI structure 111 and the MDTI structure 110. In some embodiments, the dielectric layer 115 comprises a first oxide layer lining sidewalls of the BDTI trench and the MDTI trench, a high-k dielectric layer disposed on the first oxide layer, and a second oxide layer filling remaining spaces of the BDTI trench and the MDTI trench.

In some embodiments, a plurality of color filters 116 is arranged over the back-side 124 of the substrate 102. The plurality of color filters 116 is respectively configured to transmit specific wavelengths of incident radiation 120. For example, a first color filter (e.g., a red color filter) may transmit light having wavelengths within a first range, while a second color filter may transmit light having wavelengths within a second range different than the first range. As an example, the plurality of color filters 116 may comprise RGB on-chip color filter on each pixel in Bayer pattern, which consists of a 2×2 color unit cell with two green filters in the diagonal positions and blue and red in the off-diagonal positions. In some embodiments, the plurality of color filters 116 may be arranged within a grid structure overlying the substrate 102. In some embodiments, the grid structure may comprise a stacked grid having a metal framework surrounded by a dielectric material. In some embodiments, the dielectric material and the stacked grid may have a same dielectric material (e.g., silicon dioxide ($SiO_2$)).

A plurality of micro-lenses 118 is arranged over the plurality of color filters 116 to increase fill-factor and sensor sensitivity. Respective micro-lenses 118 are aligned laterally with the color filters 116 and overlie the pixel regions 103a, 103b. In some embodiments, the plurality of micro-lenses 118 has a substantially flat bottom surface abutting the plurality of color filters 116 and a curved upper surface. The curved upper surface is configured to focus the incident radiation 120 (e.g., light towards the underlying pixel regions 103a, 103b). During operation of the CMOS image sensor, the incident radiation 120 is focused by the micro-lens 118 to the underlying pixel regions 103a, 103b. When incident radiation of sufficient energy strikes the photodiode 104, it generates an electron-hole pair that produces a photocurrent. Notably, though the micro-lenses 118 is shown as fixing onto the image sensor in FIG. 1, it is appreciated that the image sensor may not include on-chip micro-lens, and the micro-lens may be attached to the image sensor later in a separate manufacture activity.

Figure 2:
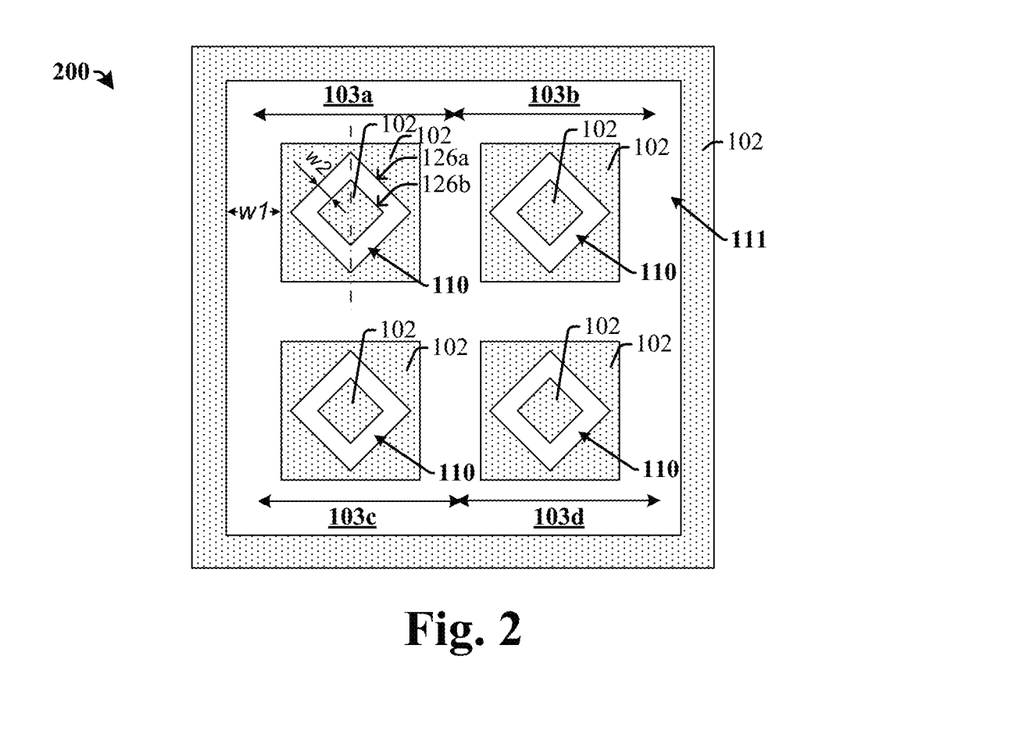
FIG. 2 illustrates a top view of the CMOS image sensor of FIG. 1 along line A-A'.

FIG. 2 illustrates a top view of the CMOS image sensor of FIG. 1 along line A-A'. As described above, the BDTI structure 111 is disposed between adjacent pixel regions 103a, 103b, 103c, 103d, and functions as isolations for the pixel regions, such that crosstalk and blooming among the pixel regions 103a, 103b, 103c, and 103d can be reduced. The MDTI structure 110 is disposed overlying individual pixel region 103a, 103b, 103c, or 103d, and confine and direct the incident radiation 120 down to the photodiode 140 of the corresponding pixel region, such that quantum efficiency of the image sensor is improved. A ratio of a first minimum width w1 of the BDTI structure 111 to a second minimum width w2 the MDTI structure 110 is in a range of from about 1:1 to about 1:4. The MDTI structure 110 may comprise a quadrangle (e.g. a square) that has a diagonal line coincide with a middle line of the pixel region (shown by dash-dotted line). The MDTI structure 110 may comprise a first perimeter 126a and a second perimeter 126b that are concentric. A common center of the first perimeter 126a and the second perimeter 126b may be a center of the corresponding pixel region. The first perimeter 126a and the second perimeter 126b are both shown as squares in FIG. 2, but first perimeter 126a and the second perimeter 126b can be same or different shapes and can include but not limited to circles or polygons.

Figure 3A:
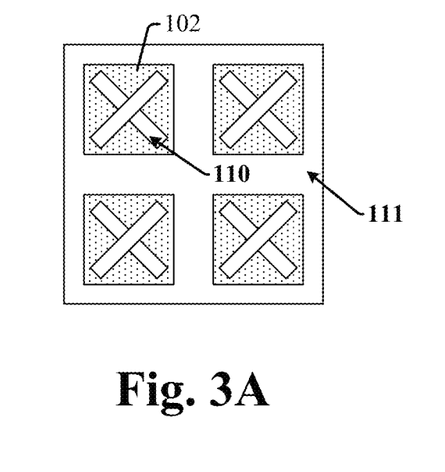
FIGS. 3A-3G illustrate a plurality of top views of some additional embodiments of a CMOS image sensor comprising a multiple deep trench isolation (MDTI) structure.
Figure 3B:
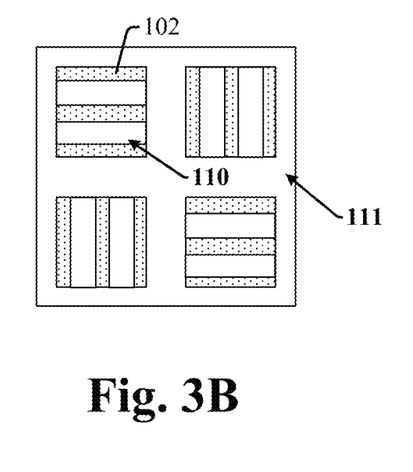
Figure 3C:
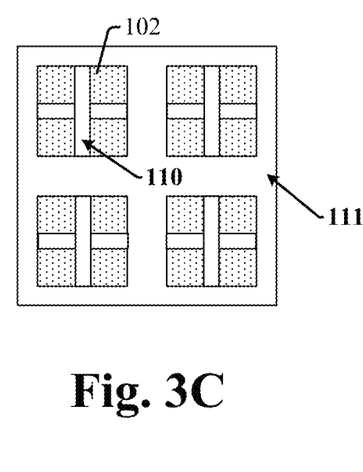
Figure 3D:
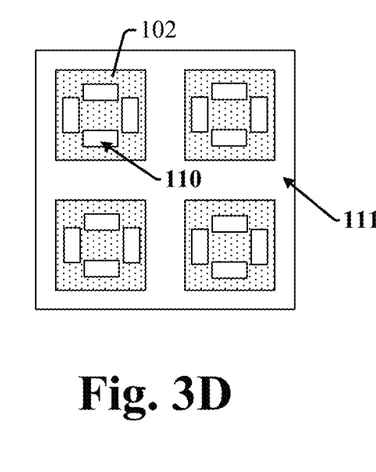
Figure 3E:
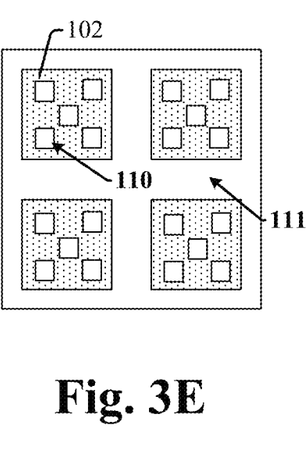
Figure 3F:
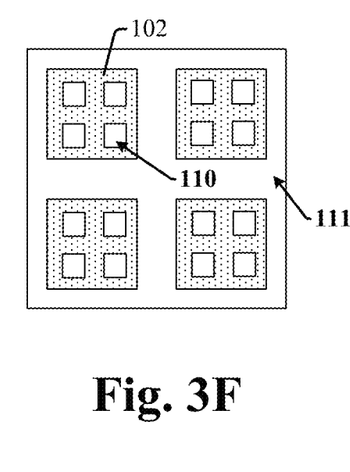
Figure 3G:
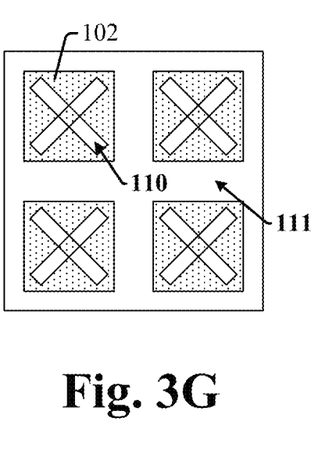

FIGS. 3A-3G illustrate a plurality of top views of some additional embodiments of a CMOS image sensor comprising a multiple deep trench isolation (MDTI) structure. It is appreciated that FIGS. 3A-3G can be considered as examples of the patterns of the MDTI structure 110 in addition to what is shown in FIG. 2 for the non-limitation purpose and may be altered for other variations. Patterns shown in FIGS. 3A-3G and other variations can be incorporated into the image sensor described in FIG. 1 and FIG. 2. As shown in FIGS. 3A and 3C, the MDTI structure 110 may comprise a first segment and a second segment that cross one other at a center region of the pixel region. As shown in FIGS. 3B and 3D-3G, the MDTI structure 110 may comprise segments that are spaced apart from one other. The segments may be symmetrical along a middle line of the pixel region. The segments may be distributed in the same pattern (e.g. FIGS. 3D-3G) or rotated from one pixel to another pixel (e.g. FIG. 3B). A center region of the substrate 102 of the pixel region may be covered by the MDTI structure 110 (e.g. FIGS. 3A, 3C, 3E) or exposed to the incident radiation (e.g. FIGS. 3B, 3D, 3F, 3G).

Figure 4A:
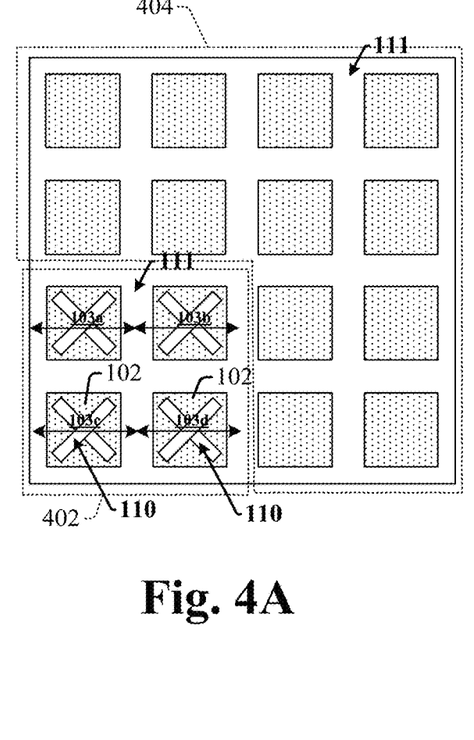
FIGS. 4A-4C illustrate a plurality of top views of some additional embodiments of a CMOS image sensor comprising a multiple deep trench isolation (MDTI) structure.
Figure 4B:
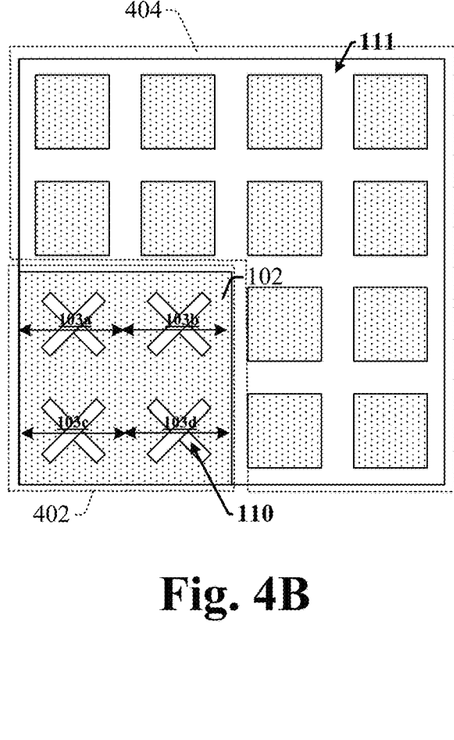
Figure 4C:
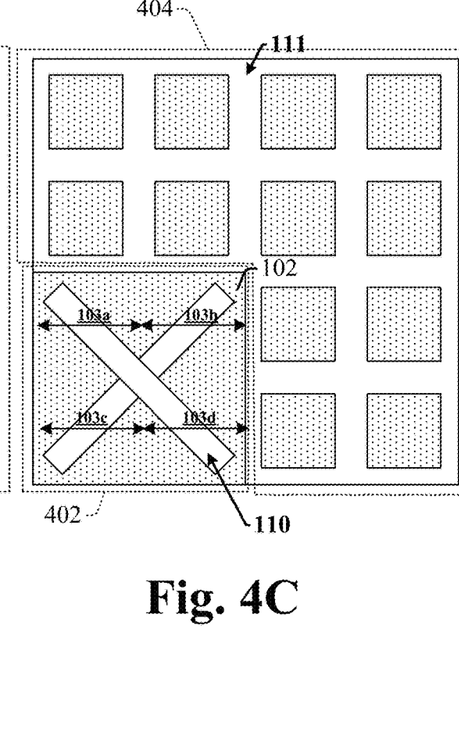

FIGS. 4A-4C illustrates a plurality of top views of some additional embodiments of a CMOS image sensor comprising a multiple deep trench isolation (MDTI) structure. In some embodiments, the CMOS image sensor comprises a plurality of pixel regions that includes a first group of pixels 402 known as phase detection autofocus (PDAF) pixels and are configured to detect image depth position for a proceeding focusing operation, and a second group of pixels 404 configured to detect image shape and color. Though not shown in the figures, the first group of pixels 402 is arranged in pairs: a pair of phase detection pixels has opposite sides open to incident radiation. For example, in some cases, one phase detection pixel of the pair has a left half region transparent to at least some incident radiance while a right half region is blocked by an opaque structure. The other phase detection pixel of the pair has a right half region transparent to at least some of the incident radiance while a left half region blocked by an opaque structure. Thus, the received radiance of the phase detection pixel pair has a phase difference from which the focus condition of the sensor can be determined. The opaque structures of the first group of pixels 402 reduce imaging sensitivity of the image sensing pixels due to the reduced pixel size and unwanted reflections. Thereby, the MDTI structure 110 is disposed within the first group of pixels 402 to improve the imaging sensitivity, especially the NIR sensitivity. Though the MDTI structure 110 may also be disposed in the second group of pixels 404, in some alternative embodiments, the MDTI structure 110 is absent from the second group of pixels 404. As shown in FIG. 4A, in some embodiments, the BDTI structure 111 is disposed between adjacent pixel regions 103a, 103b, 103c, 103d of the first group of pixels 402, as it is disposed between adjacent pixels of the second group of pixels 404. As shown in FIG. 4B and FIG. 4C, in some alternative embodiments, the BDTI structure 111 is absent from boundary regions between adjacent pixel regions 103a, 103b, 103c, 103d of the first group of pixels 402, as the adjacent pixels may be collectively used as one phase detection pixel. The MDTI structure 110 may be respectively arranged in the adjacent pixel regions 103a, 103b, 103c, 103d as repeated units (e.g. FIG. 4B), or the MDTI structure 110 may be arranged in the adjacent pixel regions 103a, 103b, 103c, 103d as one continuous integral unit (e.g. FIG. 4C). Though the MDTI structure 110 of FIGS. 4A-4C uses the pattern of FIG. 3A as an example, it is also understood that the patterns shown in FIGS. 2 and 3B-3G and other applicable variations can also be used.

Figure 5:
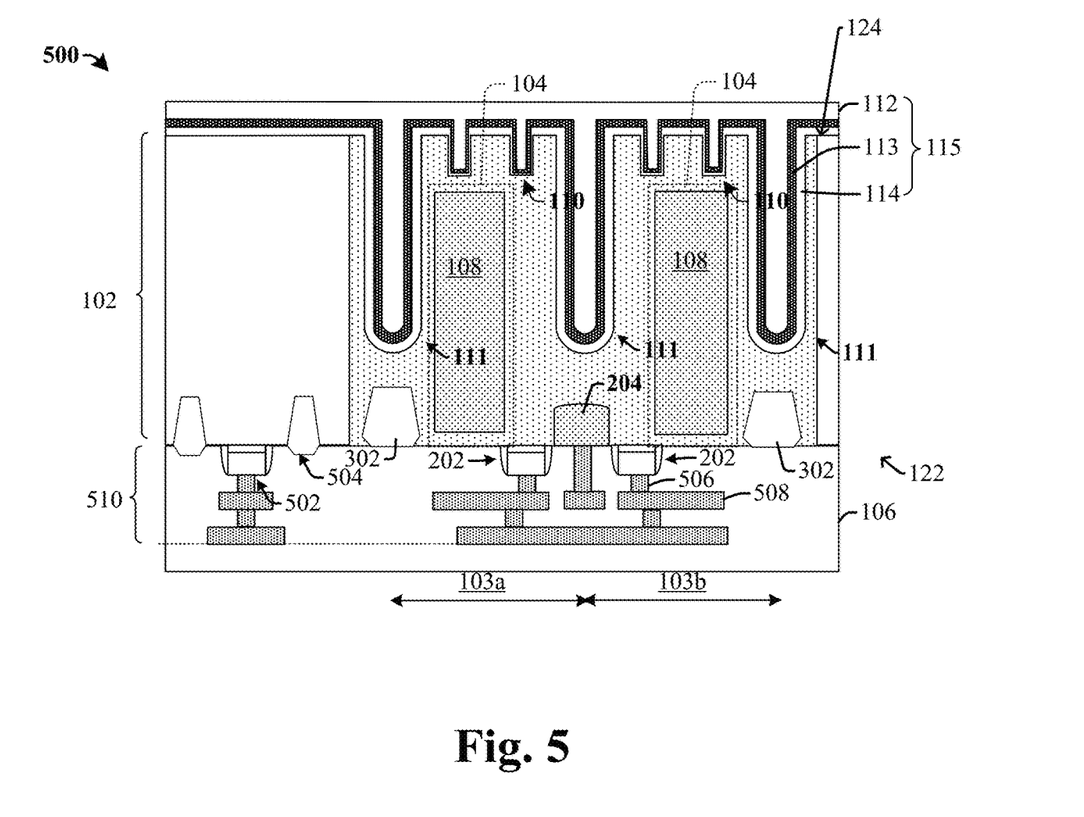
FIG. 5 illustrates a cross-sectional view of some additional embodiments of an integrated chip comprising an image sensor having a multiple deep trench isolation (MDTI) structure.

FIG. 5 illustrates a cross-sectional view of some additional embodiments of an integrated chip comprising an image sensor having a multiple deep trench isolation (MDTI) structure. Besides similar features shown and described above, in some embodiments, as shown in FIG. 5, the dielectric layer 115 of the BDTI structure 111 may comprise a high-k dielectric liner 113 disposed between a first oxide layer 114 and a second oxide layer 112. The high-k dielectric liner 113 may function as a passivation layer and separate the first oxide layer 114 from second oxide layer 112. The high-k dielectric liner 113 may comprise aluminum oxide (AlO), tantalum oxide (TaO), hafnium oxide (HfO), hafnium silicon oxide (HfSiO), hafnium aluminum oxide (HfAlO), or hafnium tantalum oxide (HfTaO), for example. The first oxide layer 114 and the high-k dielectric liner 113 may be conformal layers. The image sensor shown in FIG. 5 may be an intermediate structure, and the first oxide layer 114, the high-k dielectric liner 113 and the second oxide layer 112 may or may not subject to a planarization process such that top surfaces of the layers could be altered, and the back-side 124 of the substrate 102 may be coplanar with top surfaces of the dielectric layer 115.

In some embodiments, a floating diffusion well 204 is disposed between the adjacent pixel regions 103a, 103b from the front-side 122 of the substrate 102 to a position within the substrate 102. A transfer gate 202 is arranged on the front-side 122 of the substrate 102 at a position laterally between the photodiode 104 and the floating diffusion well 204. During the operation, the transfer gate 202 controls charge transfer from the photodiode 104 to the floating diffusion well 204. If the charge level is sufficiently high within the floating diffusion well 204, a source follower transistor (not shown) is activated and charges are selectively output according to the operation of a row select transistor (not shown) used for addressing. A reset transistor (not shown) can be used to reset the photodiode 104 between exposure periods. In some embodiments, a shallow trench isolation (STI) structure 302 is disposed at boundary regions of the pixel regions 103a, 103b from the front-side 122 of the substrate 102 to a position within the substrate 102 and surrounding the photodiode 104. The STI structure 302 and the BDTI structure 111 may be vertically aligned (e.g. sharing a common center line).

In some embodiments, a back-end-of-the-line (BEOL) metallization stack 510 is arranged on the front-side 122 of the substrate 102. The BEOL metallization stack 510 comprises a plurality of metal interconnect layers arranged within one or more inter-level dielectric (ILD) layers 106. The ILD layers 106 may comprise one or more of a low-k dielectric layer (i.e., a dielectric with a dielectric constant less than about 3.9), an ultra low-k dielectric layer, or an oxide (e.g., silicon oxide). A logic gate device 502 may be disposed on the same integrated chip of the image sensor and isolated by a logic STI structure 504. The logic STI structure 504 may have same or different dimensions of the STI structure 302. Conductive contacts 506 are arranged within the ILD layers 106. The conductive contacts 506 extend from the transfer gate 202 and the floating diffusion well 204 to one or more metal wire layers 508. In various embodiments, the conductive contacts 506 may comprise a conductive metal such as copper or tungsten, for example.

FIGS. 6-11 illustrate some embodiments of cross-sectional views showing a method of forming a CMOS image sensor having a multiple deep trench isolation (MDTI) structure.

Figure 6:
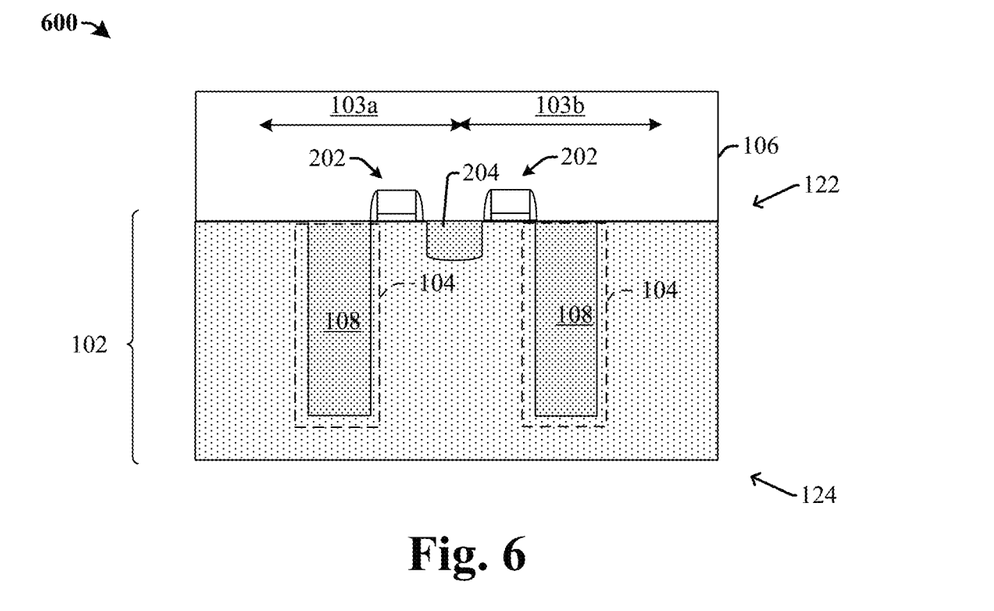
FIGS. 6-10 illustrate some embodiments of cross-sectional views showing a method of forming a CMOS image sensor having a multiple deep trench isolation (MDTI) structure.

As shown in cross-sectional view 600 of FIG. 6, a substrate 102 is prepared. In various embodiments, the substrate 102 may comprise any type of semiconductor body (e.g., silicon/CMOS bulk, SiGe, etc.) such as a semiconductor wafer or one or more die on a wafer, as well as any other type of semiconductor and/or epitaxial layers formed thereon and/or otherwise associated therewith. The substrate 102 may be prepared including a blanket implant or a grading epitaxial growth process with a first doping type (e.g. p-type). CMOS devices are formed over the substrate, including a transfer gate 202 by depositing a gate dielectric film and a gate electrode film over the substrate 102. The gate dielectric film and the gate electrode film are subsequently patterned to form a gate dielectric layer and a gate electrode. Implantation processes are performed within the front-side 122 of the substrate 102 to form a floating diffusion well 204 along one side of the transfer gate 202 or opposing sides of a pair of the transfer gates 202 as shown in FIG. 6. In some embodiments, the substrate 102 may be selectively implanted according to a patterned masking layer (not shown) comprising photoresist. A photodiode 104 is formed within the substrate 102, including a doped layer 108 formed within a front-side 122 of the substrate 102 at another side of the transfer gate 202 opposing to the diffusion well 204. The doped layer 108 may be formed by implanting dopant species with a second doping type (e.g. an n-type dopant (e.g., phosphorous).

Though not shown in FIG. 6, a BEOL metallization stack comprising a plurality of metal interconnect layers arranged within an ILD layer (e.g. referring to FIG. 5 for the BEOL metallization stack 510 and the ILD layer 106) can be formed over the front-side 122 of the substrate 102. In some embodiments, the BEOL metallization stack may be formed by forming the ILD layer, which comprises one or more layers of ILD material, over the front-side 122 of the substrate 102. The ILD layer is subsequently etched to form via holes and/or metal trenches. The via holes and/or metal trenches are then filled with a conductive material to form the plurality of metal interconnect layers. In some embodiments, the ILD layer may be deposited by a physical vapor deposition technique (e.g., PVD, CVD, etc.). The plurality of metal interconnect layers may be formed using a deposition process and/or a plating process (e.g., electroplating, electroless plating, etc.). In various embodiments, the plurality of metal interconnect layers may comprise tungsten, copper, or aluminum-copper, for example. The ILD layer can be then bonded to a handle substrate (not shown). In some embodiments, the bonding process may use an intermediate bonding oxide layer arranged between the ILD layer and the handle substrate. In some embodiments, the bonding process may comprise a fusion bonding process.

Figure 7:
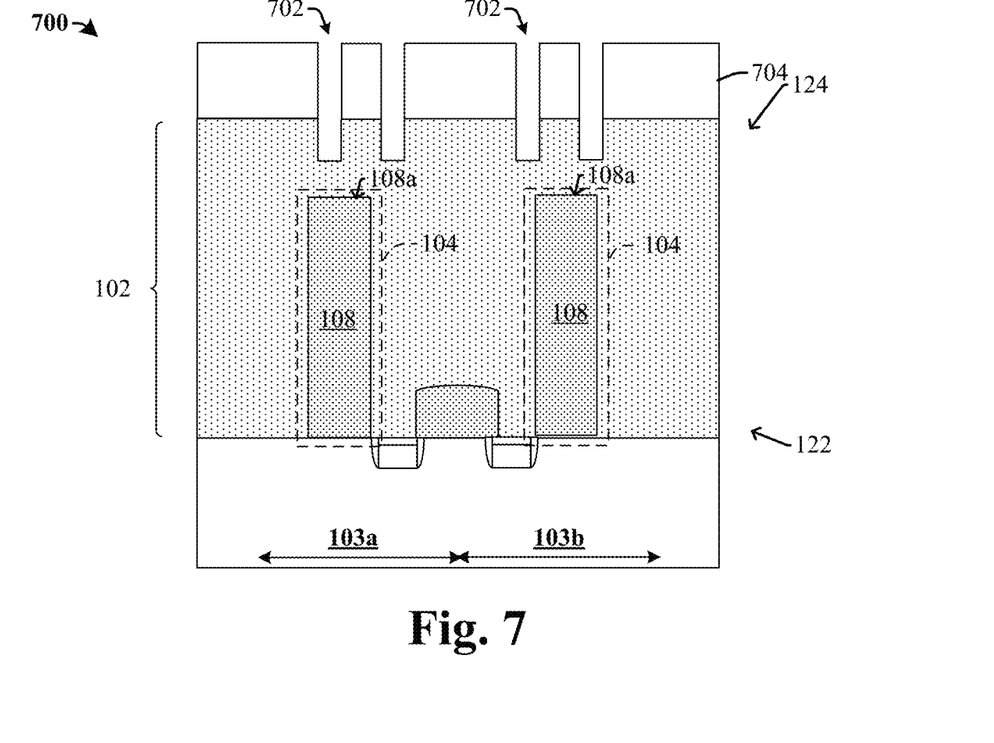

As shown in cross-sectional view 700 of FIG. 7, the substrate 102 is flipped over for further processing on a back-side 124 that is opposite to the front-side 122. The substrate 102 is selectively etched to form a MDTI trench 702 within the back-side 124 of the substrate 102 within individual pixel region 103a, 103b. In some embodiments, the substrate 102 may be etched by forming a masking layer 704 onto the back-side 124 of the substrate 102. The substrate 102 is then exposed to an etchant in regions not covered by the masking layer 704. The etchant etches the substrate 102 to form the MDTI trench 702 extending to the substrate 102 and overlying the doped layer 108. In some embodiments, the MDTI trench 702 may stop at a depth of the substrate 102 above the doped layer 108. In some alternative embodiments not shown in FIG. 7, the MDTI trench 702 may reach a depth of the substrate 102 lower than a top surface 108a of the doped layer 108.

Figure 8:
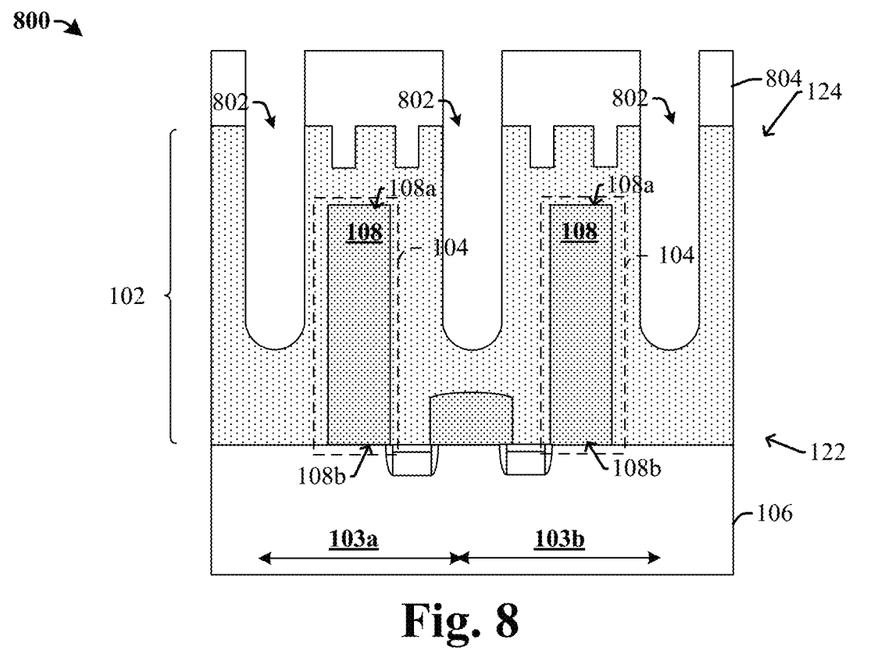

As shown in cross-sectional view 800 of FIG. 8, a second etch process is performed to form a BDTI trench 802 within the back-side 124 of the substrate 102 between adjacent pixel regions 103a, 103b. In some embodiments, the substrate 102 may be etched by forming a masking layer 804 onto the back-side 124 of the substrate 102. The substrate 102 is then exposed to an etchant in regions not covered by the masking layer 804. The etchant etches the substrate 102 to form the BDTI trench 802 extending to the substrate 102 to a depth lower than the top surface of the doped layer 108.

In some embodiments, the BDTI trench 802 may stop at a depth of the substrate 102 above a bottom surface of the doped layer 108. In some alternative embodiments not shown in FIG. 8, the BDTI trench 802 may reach a depth of the substrate 102 lower than a bottom surface 108b of the doped layer 108.

In various embodiments, the masking layer 704 of FIG. 7 and the masking layer 804 of FIG. 8 may comprise photoresist or a nitride (e.g., SiN) patterned using a photolithography process. In various embodiments, the etchant of FIG. 7 and FIG. 8 may comprise a dry etchant have an etching chemistry comprising a fluorine species (e.g., $CF_4$, $CHF_3$, $C_4F_8$, etc.) or a wet etchant (e.g., hydrofluoric acid (HF) or Tetramethylammonium hydroxide (TMAH)). The substrate 102 may be thinned to reduce a thickness of the substrate 102 before forming the MDTI trench 702 and allow for radiation to pass through the back-side 124 of the substrate 102 to the photodiode 104. In some embodiments, the substrate 102 may be thinned by etching the back-side 124 of the semiconductor substrate. In other embodiments, the substrate 102 may be thinned by mechanical grinding the back-side 124 of the semiconductor substrate. The order to form the MDTI trench 702 and the BDTI trench 802 is exchangeable, i.e., the MDTI trench 702 may be formed prior to or after forming the BDTI trench 802.

Figure 9:
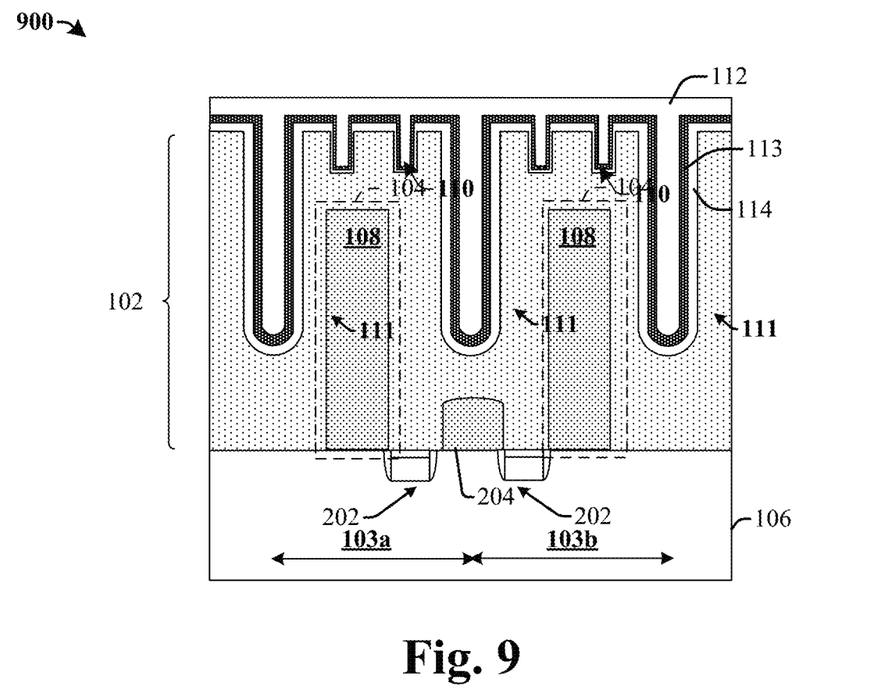

As shown in cross-sectional view 900 of FIG. 9, the MDTI trench 702 and the BDTI trench 802 are filled with dielectric material. In some embodiments, a first oxide layer 114 is deposited along sidewalls of the MDTI trench 702 and the BDTI trench 802 in conformal. A high-k dielectric liner 113 is formed on the first oxide layer 114. The high-k dielectric liner 113 may be formed by deposition techniques and may comprise aluminum oxide (AlO), hafnium oxide (HfO), tantalum oxide (TaO) or other dielectric materials having a dielectric constant greater than that of silicon oxide. The first oxide layer 114 and the high-k dielectric liner 113 line sidewalls and bottom surfaces of the MDTI trench 702 and the BDTI trench 802. In some embodiments, the first oxide layer 114 and the high-k dielectric liner 113 may extend over the back-side 124 of the substrate 102 between the MDTI trench 702 and the BDTI trench 802. A second oxide layer 112 is formed to fill a remainder of the MDTI trench 702 and the BDTI trench 802. In some embodiments, a planarization process is performed after forming the second oxide layer 112 to form a planar surface that extends along an upper surface of the high-k dielectric liner 113 and the second oxide layer 112. In some embodiments, the first oxide layer 114, the high-k dielectric liner 113 and the second oxide layer 112 may be deposited using a physical vapor deposition technique or a chemical vapor deposition technique.

Figure 10:
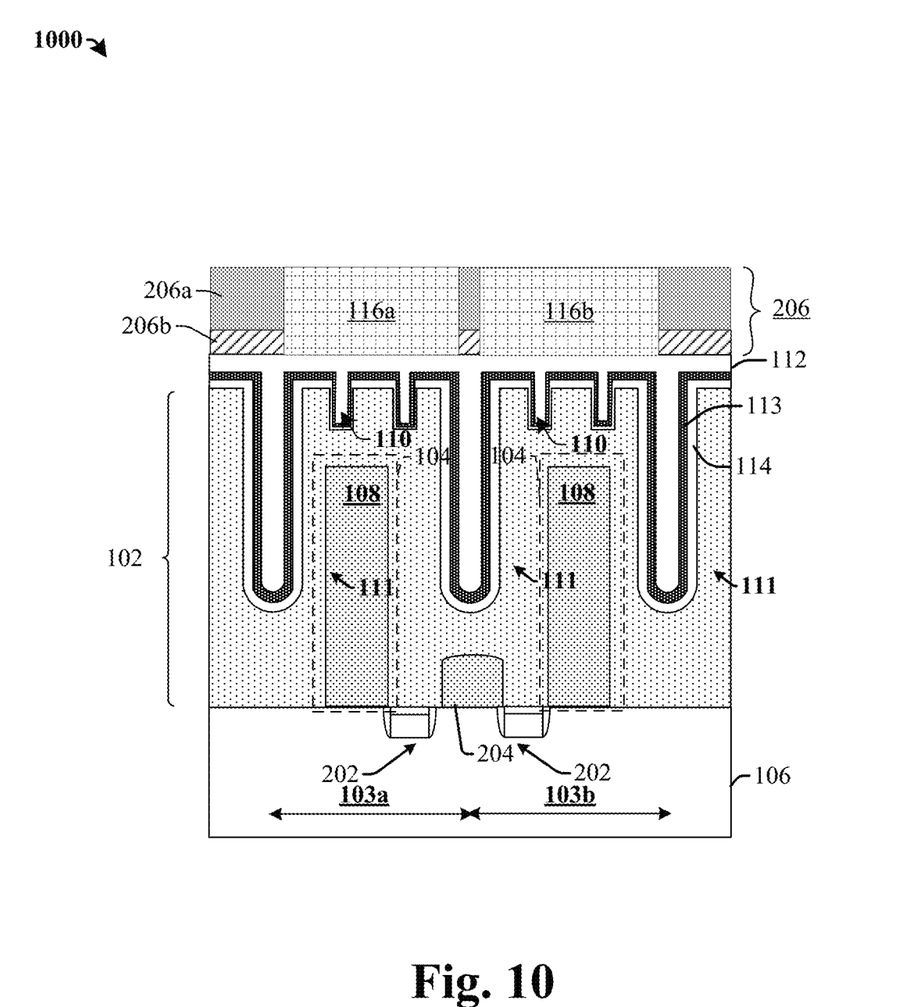

As shown in cross-sectional view 1000 of FIG. 10, a plurality of color filters 116a, 116b can be subsequently formed over the back-side 124 of the substrate 102. In some embodiments, the plurality of color filters 116a, 116b may be formed by forming a color filter layer and patterning the color filter layer and forming a composite grid 206 between the color filters 116a, 116b for isolation purpose. In some embodiments, the composite grid 206 comprises a metal grid structure 206b disposed within a dielectric light guide structure 206a. In some embodiments, the dielectric light guide structure 206a may comprise one or more dielectric structures, for example, a silicon nitride grid, silicon oxynitride grid, or a silicon dioxide grid. In some embodiments, The color filter layer is formed of a material that allows for the transmission of radiation (e.g., light) having a specific range of wavelength while blocking light of wavelengths outside of the specified range. Though not shown in FIG. 10, in some embodiments, a plurality of micro-lenses (e.g. referring to the micro-lenses 118 shown in FIG. 1) may be formed over the plurality of color filters 116a, 116b. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses is then formed by selectively etching the micro-lens material according to the micro-lens template.

Figure 11:
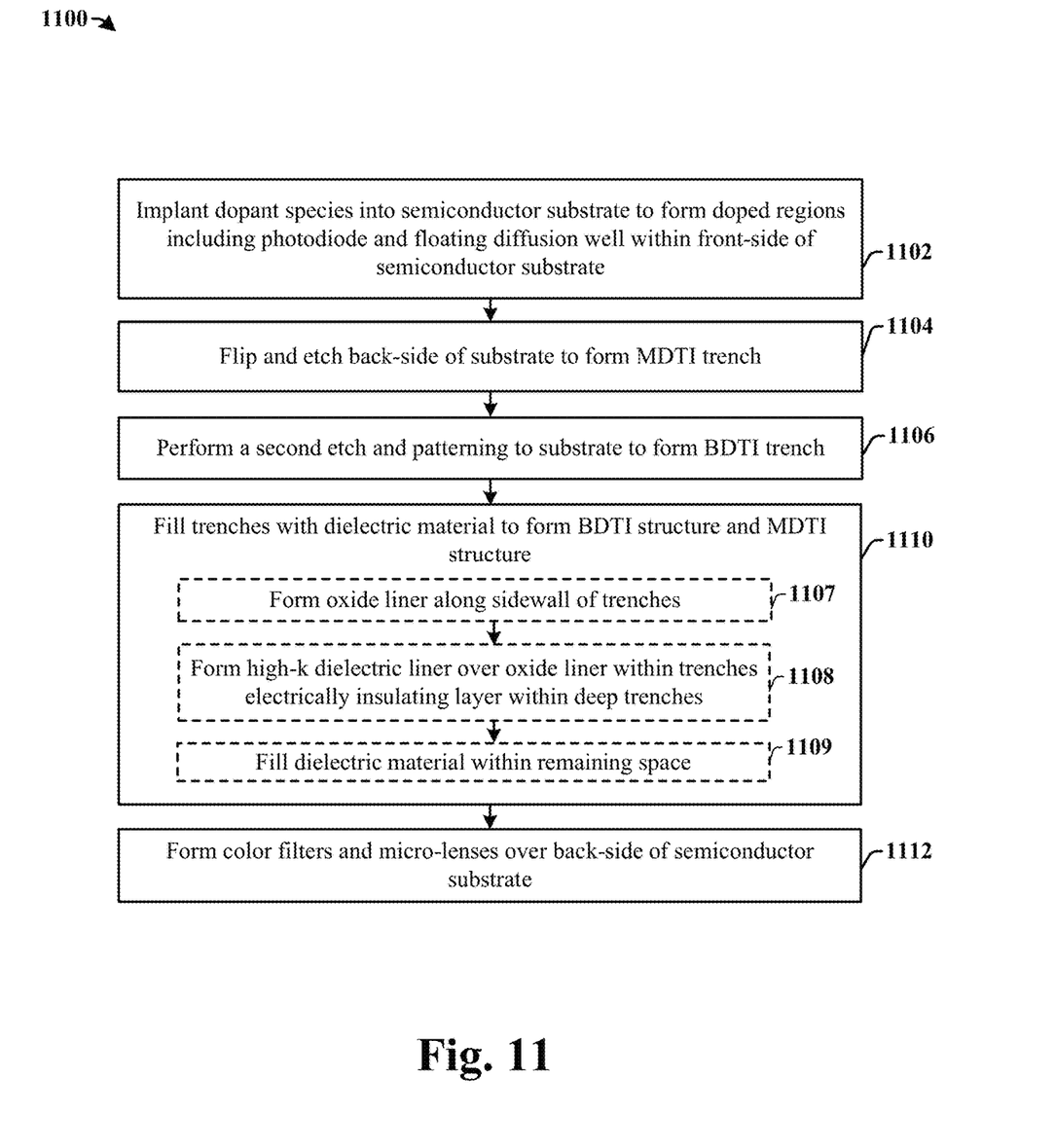
FIG. 11 illustrates a flow diagram of some embodiments of a method of forming a CMOS image sensor having a multiple deep trench isolation (MDTI) structure.

FIG. 11 illustrates a flow diagram of some embodiments of a method 1100 of forming a CMOS image sensor having a multiple deep trench isolation (MDTI) structure.

While disclosed method 1100 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1102, a substrate is prepared. A photodiode is formed within the front-side of the substrate, including a doped layer with a first doping type (e.g. n-type) formed within a front-side of the substrate and an adjoining region of the substrate with a second doping type (e.g. p-type). The substrate may be prepared including a blanket implant or a grading epitaxial growth process with the second doping type (e.g. p-type). The doped layer may be formed by implanting dopant species with the first doping type (e.g. an n-type dopant (e.g., phosphorous). FIG. 6 illustrates a cross-sectional view corresponding to some embodiments corresponding to act 1102.

At 1104, the substrate is flipped over for further processing. A back-side of the substrate is selectively etched to form a MDTI trench extending into the substrate within individual pixel regions. In some embodiments, the substrate is etched by forming a masking layer onto the back-side of the substrate. The substrate is then exposed to an etchant in regions overlying the doped layer and not covered by the masking layer to form the MDTI trench. In some embodiments, the MDTI trench may stop at a depth of the substrate above the doped layer. FIG. 7 illustrates a cross-sectional view corresponding to some embodiments corresponding to act 1104.

At 1106, a second etch process is performed to form a BDTI trench extending into the substrate. The BDTI trench is formed between adjacent pixel regions and surrounding the photodiode. The BDTI trench may extend to the substrate to a depth lower than the top surface of the doped layer and higher than a bottom surface of the doped layer. FIG. 8 illustrates a cross-sectional view corresponding to some embodiments corresponding to act 1106.

At 1110, the MDTI trench and the BDTI trench are filled with dielectric materials to form a MDTI structure and a BDTI structure. At 1107, a first oxide layer is formed lining sidewalls of the MDTI trench and the BDTI trench in conformal. At 1108, a high-k dielectric liner is formed within the MDTI trench and the BDTI trench onto the doped layer. At 1109, a second oxide layer is formed to fill a remainder of the MDTI trench and the BDTI trench. The first oxide layer, the high-k dielectric liner, and the second oxide layer may be formed by deposition technologies such as chemical vapor deposition. FIG. 9 illustrates a cross-sectional view corresponding to some embodiments corresponding to act 1110.

At 1112, color filters and micro-lenses are formed over the back-side of the semiconductor substrate. FIG. 10 illustrates a cross-sectional view corresponding to some embodiments corresponding to act 1112.

Therefore, the present disclosure relates to a CMOS image sensor having a multiple deep trench isolation (MDTI) structure, and an associated method of formation. In some embodiments, the CMOS image sensor comprises a plurality of pixel regions disposed on the substrate and respectively comprising a photodiode. A boundary deep trench isolation (BDTI) structure is disposed between adjacent pixel regions and surrounding the photodiode. A multiple deep trench isolation (MDTI) structure is disposed within the individual pixel region and overlying the photodiode. A dielectric layer fills in a BDTI trench of the BDTI structure and a MDTI trench of the MDTI structure. By forming the disclosed BDTI structure and MDTI structure, incident radiation is better confined and guided to the photodiode. Thereby, sensing sensitivity of the image sensor especially in the NIR range is improved, and the blooming and crosstalk are reduced.

In some embodiments, the present disclosure relates to a method of forming a CMOS image sensor. In the method, a plurality of photodiodes is formed from a front-side of a substrate. A plurality of boundary deep trench isolation (BDTI) trenches having a first depth and a plurality of multiple deep trench isolation (MDTI) trenches having a second depth are formed from a back-side of the substrate. A stack of dielectric layers is formed in the BDTI trenches and the MDTI trenches. A plurality of color filters is formed overlying the stack of dielectric layers corresponding to the plurality of photodiodes.

In some alternative embodiments, the present disclosure relates to a method of forming a CMOS image sensor. In the method, a transfer gate is formed on a front-side of a substrate. A photodiode is formed in a pixel region at one side of the transfer gate and configured to convert radiation that enters the substrate from the back-side into an electrical signal. The substrate is flipped and a boundary deep trench isolation (BDTI) trench with a first depth and a multiple deep trench isolation (MDTI) trench with a second depth are formed from a back-side of the substrate. A stack of dielectric layers is formed in the BDTI trench and the MDTI trench conformally lining sidewalls of the BDTI trench and the MDTI trench In yet other embodiments, the present disclosure relates to a method of forming a CMOS image sensor. In the method, a transfer gate over a front-side of a substrate and a doped layer is formed within the substrate at one side of the transfer gate corresponding to a photodiode of a pixel region. The substrate is flipped and a first etching process is performed to etch from a back-side of the substrate to form a multiple deep trench isolation (MDTI) trench overlying the doped layer. A second etch process is performed from the back-side of the substrate to form a boundary deep trench isolation (BDTI) trench between adjacent pixel regions and surrounding the photodiode. The MDTI trench and the BDTI trench are filled with a stack of dielectric layers to form a MDTI structure overlying the doped layer and a BDTI structure between the adjacent pixel regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A method for forming a CMOS image sensor, comprising:
    forming a plurality of photodiodes from a front-side of a substrate,
    forming a plurality of boundary deep trench isolation (BDTI) trenches having a first depth and a plurality of multiple deep trench isolation (MDTI) trenches having a second depth from a back-side of the substrate;
    forming a stack of dielectric layers in the BDTI trenches and the MDTI trenches; and
    forming a plurality of color filters overlying the stack of dielectric layers corresponding to the plurality of photodiodes.

2. The method of claim 1, wherein plurality of photodiodes in the substrate is formed by forming a doped layer with a first doping type different from a second doping type of an adjoining region of the substrate, wherein the photodiodes are configured to convert radiation that enters the substrate from the back-side into an electrical signal.

3. The method of claim 2, wherein the plurality of MDTI trenches is formed by etching the substrate from the back-side at a position directly overlying the doped layer to the second depth not reaching the doped layer of the plurality of photodiodes.

4. The method of claim 2, wherein the plurality of BDTI trenches is formed by etching the substrate from the back-side at a position surrounding the doped layer to the first depth greater than the second depth.

5. The method of claim 1, wherein the plurality of BDTI trenches and the plurality of MDTI trenches are formed to have a ratio of the first depth to the second depth is in a range of from about 1:2 to about 1:6.

6. The method of claim 1, wherein the plurality of BDTI trenches and the plurality of MDTI trenches are formed to have a ratio of a first minimum width of the BDTI trenches to a second minimum width the MDTI trenches is in a range of from about 1:1 to about 1:4.

7. The method of claim 1, wherein forming the stack of dielectric layers comprises:
    forming a first oxide layer lining sidewalls of the BDTI trench and the MDTI trench;
    forming a high-k dielectric layer on the first oxide layer and extending in the BDTI trenches and the MDTI trenches;
    forming a second oxide layer on the high-k dielectric layer and extending in the BDTI trenches and the MDTI trenches.

8. The method of claim 1, wherein the stack of dielectric layers is formed continuously between the BDTI trenches and the MDTI trenches.

9. The method of claim 1, wherein the stack of dielectric layers is formed by a series of physical vapor deposition processes or chemical vapor deposition processes.

10. The method of claim 1, further comprising forming a plurality of color filters overlying the stack of dielectric layers corresponding to the plurality of photodiodes.

11. A method for forming a CMOS image sensor, comprising:
    forming a transfer gate on a front-side of a substrate;
    forming a photodiode in a pixel region at one side of the transfer gate and configured to convert radiation that enters the substrate from a back-side into an electrical signal; and
    forming a boundary deep trench isolation (BDTI) trench with a first depth and a multiple deep trench isolation (MDTI) trench with a second depth from a back-side of the substrate; and
    forming a stack of dielectric layers in the BDTI trench and the MDTI trench conformally lining sidewalls of the BDTI trench and the MDTI trench.

12. The method of claim 11, wherein forming the stack of dielectric layers comprises forming a high-k dielectric liner sandwiched by a first oxide layer and a second oxide layer.

13. The method of claim 12, wherein the first oxide layer fills in the BDTI trench and continuously extends in lateral between the BDTI trench and the MDTI trench.

14. The method of claim 11, wherein the stack of dielectric layers is formed with a planar top surface.

15. The method of claim 11, wherein the MDTI trench is formed to have segments that are spaced apart from one other and are symmetrical along a middle line of the pixel region.

16. The method of claim 11, wherein the MDTI trench is formed to be a quadrangle that has a diagonal line coincide with a middle line of the pixel region.

17. The method of claim 11, wherein the MDTI trench is formed to have a first perimeter and a second perimeter concentric to one another.

18. The method of claim 11, wherein the MDTI trench is formed to have a first segment and a second segment that cross one other at a center region of the pixel region.

19. A method of forming an image sensor, comprising:
    forming a transfer gate over a front-side of a substrate and a doped layer within the substrate at one side of the transfer gate corresponding to a photodiode of a pixel region;
    performing a first etching process to etch from a back-side of the substrate to form a multiple deep trench isolation (MDTI) trench overlying the doped layer;
    performing a second etch process from the back-side of the substrate to form a boundary deep trench isolation (BDTI) trench between adjacent pixel regions and surrounding the photodiode; and
    filling the MDTI trench and the BDTI trench with a stack of dielectric layers to form a MDTI structure overlying the doped layer and a BDTI structure between the adjacent pixel regions.

20. The method of claim 19,
    wherein a plurality of pixel regions are formed having a first group of pixels that are configured as phase detection autofocus (PDAF) pixels and a second group of pixels;
    wherein the MDTI structure is formed within the first group of pixels and is absent from the second group of pixels;

wherein the BDTI structure is absent from a boundary region between adjacent pixels of the first group of pixels.

* * * * *